(12) United States Patent
Li et al.

(10) Patent No.: US 7,146,454 B1
(45) Date of Patent: Dec. 5, 2006

(54) HIDING REFRESH IN 1T-SRAM ARCHITECTURE

(75) Inventors: Jun Li, Fremont, CA (US); Joseph Tzou, Mountain View, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 305 days.

(21) Appl. No.: 10/124,773

(22) Filed: Apr. 16, 2002

(51) Int. Cl.
*G06F 12/08* (2006.01)

(52) U.S. Cl. ............................ 711/6; 711/156; 711/145; 711/144

(58) Field of Classification Search ................ 711/106, 711/103, 100, 5, 6, 145, 144, 156; 365/222; 710/100
See application file for complete search history.

(56) References Cited

U.S. PATENT DOCUMENTS

| | | | | |
|---|---|---|---|---|
| 5,895,487 A | * | 4/1999 | Boyd et al. | 711/122 |
| 5,999,474 A | * | 12/1999 | Leung et al. | 365/222 |
| 6,067,595 A | * | 5/2000 | Lindenstruth | 710/307 |
| 6,075,728 A | * | 6/2000 | Inoue et al. | 365/189.01 |
| 6,330,636 B1 | * | 12/2001 | Bondurant et al. | 711/105 |
| 6,405,273 B1 | * | 6/2002 | Fleck et al. | 710/310 |
| 6,415,353 B1 | * | 7/2002 | Leung | 711/106 |
| 6,434,661 B1 | * | 8/2002 | Konishi et al. | 711/105 |
| 6,449,685 B1 | * | 9/2002 | Leung | 711/106 |
| 6,581,126 B1 | * | 6/2003 | Regula | 710/305 |
| 6,687,181 B1 | * | 2/2004 | Usuki et al. | 365/230.03 |

FOREIGN PATENT DOCUMENTS

EP   0 642 685 B1 * 3/1995

OTHER PUBLICATIONS

Hodges et al., "Semiconductor Memories," Analysis and Design of Digital Integrated Circuits, Sec. 9.3, pp. 372-380 (McGraw-Hill, 2nd ed. 1988).*
Grimes, "The Intel i860 64-Bit Processor: A General-Purpose CPU with 3D Graphics Capabilities," IEEE Computer Graphics & Applications, pp. 85-88 (Jul. 1989).*
Dosaka, et al., "A 100MHz 4Mb Cobe Cache DRAM with Fast Copy-back Scheme," Digest of Technical Papers, 1992 IEEE International Solid-State Circuits Conference, pp. 148-149 (Jun. 1992).*
Niijima, et al., "QRAM-Quick Access Memory System", IEEE International Conference on Compute Design: V.L.S.I. In Computers and Processors, pp. 417-420 (Sep. 17, 1990).*

* cited by examiner

*Primary Examiner*—Pierre-Michel Bataille (57) ABSTRACT

A method and device for handling the refresh requirements of a DRAM or 1-Transistor memory array such that the memory array is fully compatible with an SRAM cache under all internal and external access conditions. This includes full compatibility when sequential operations alternate between memory cells in same row and column locations within different memory banks. The device includes bi-directional buses to allow read and write operations to occur between memory banks and cache over the same bus. The refresh operations can be carried out without interference with external accesses under any conditions.

24 Claims, 6 Drawing Sheets

400

| Row | Read/write | Cache Miss | Flag M bit | Function | Refresh | Set M bit |
|---|---|---|---|---|---|---|
| 1A | Read | No | No check | Read data from cache | Free for N banks | X |
| 1B | Write | | | Write data into cache | Free for N banks | M=1 |
| 2 | Read | Yes | 0 | Read data from memory and write into cache | Free for N-1 banks | M=0 |
| 3 | Read | Yes | 1 | Write cache data back into memory Read data from memory and write into cache | Free for N-2 banks | M=0 |
| 4 | Write | Yes | 0 | Write external data into memory and read out to the cache. (Now same - set M=0) | Free for N-1 banks | M=0 |
| 5 | Write | Yes | 1 | Write cache data back into memory Write external data into memory and read out to the cache. (Now same - set M=0) | Free for N-2 banks | M=0 |

Figure 1A (Conventional Art)

| Read/write | Cache Miss | Flag M bit | Function | Set M bit |
|---|---|---|---|---|
| Read | No | No check | Read data from cache | X |
| Write | | | Write data into cache | M=1 |
| Read | Yes | 0 | Read data from memory and write into cache | M=0 |
| Read | Yes | 1 | Write cache data back into memory Read data from memory and write into cache | M=0 |
| Write | Yes | 0 | Write external data into cache with data read from memory | M=1 |
| Write | Yes | 1 | Write cache data back into memory Write external data into cache with data read from memory | M=1 |

| Row | Read/write | Cache Miss | Flag M bit | Function | Refresh | Set M bit |
|---|---|---|---|---|---|---|
| 1A | Read | No | No check | Read data from cache | Free for N banks | X |
| 1B | Write | | | Write data into cache | Free for N banks | M=1 |
| 2 | Read | Yes | 0 | Read data from memory and write into cache | Free for N-1 banks | M=0 |
| 3 | Read | Yes | 1 | Write cache data back into memory Read data from memory and write into cache | Free for N-2 banks | M=0 |
| 4 | Write | Yes | 0 | Write external data into memory and read out to the cache. (Now same - set M=0) | Free for N-1 banks | M=0 |
| 5 | Write | Yes | 1 | Write cache data back into memory Write external data into memory and read out to the cache. (Now same - set M=0) | Free for N-2 banks | M=0 |

HIDING REFRESH IN 1T-SRAM ARCHITECTURE

BACKGROUND OF THE INVENTION

1. Field of the Invention

The present invention relates to the field of semiconductor memories. Specifically, embodiments of the present invention relate to a method and apparatus for handling data storage in a semiconductor memory.

2. Related Art

A conventional DRAM (dynamic random access memory) memory cell, which consists of one transistor and one capacitor, is significantly smaller than a conventional SRAM (static random access memory) cell, which typically consists of 6 transistors in a corresponding technology. However, data stored in a DRAM cell must be periodically refreshed, while the data stored in an SRAM cell has no such requirement. Each memory refresh operation of a DRAM cell utilizes memory bandwidth. If an external access and a refresh access can be initiated at the same time, the DRAM array must be able to handle both within the allowable access cycle time so as to prevent the refresh from interfering with the external access. If, for example, the cycle time of a 100 MHz DRAM array is 10 ns, each external access may take 10 ns and each refresh may take 10 ns, the external access cycle time may be no less than 20 ns. As a result, the maximum accessing frequency of the DRAM array must be less than or equal to 50 MHz. Thus, a 100 MHz DRAM memory array is required to create a device effectively operating at 50 MHz and this is not efficient.

Previous attempts to use DRAM cells in SRAM applications have been of limited success for various reasons. For example, one such DRAM device requires an external signal to control refresh operations. External accesses to this DRAM device are delayed during refresh operations, resulting in the refresh operation not being transparent. As a result, this device cannot be fully compatible with an SRAM device.

Other conventional art schemes use multi-banking to reduce the average access time of a DRAM device. These multi-banking schemes do not allow an individual memory bank to delay a refresh cycle.

Figure 1A:
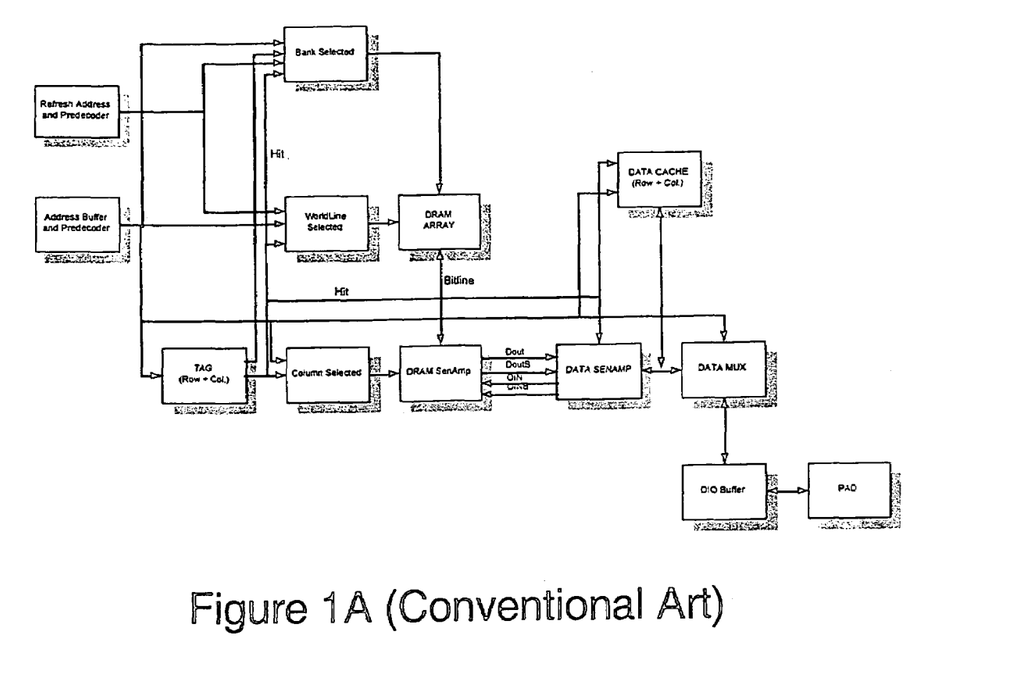
FIG. 1A is a block diagram of a DRAM memory architecture with SRAM cache according to an embodiment of the conventional art.
Figure 1B:
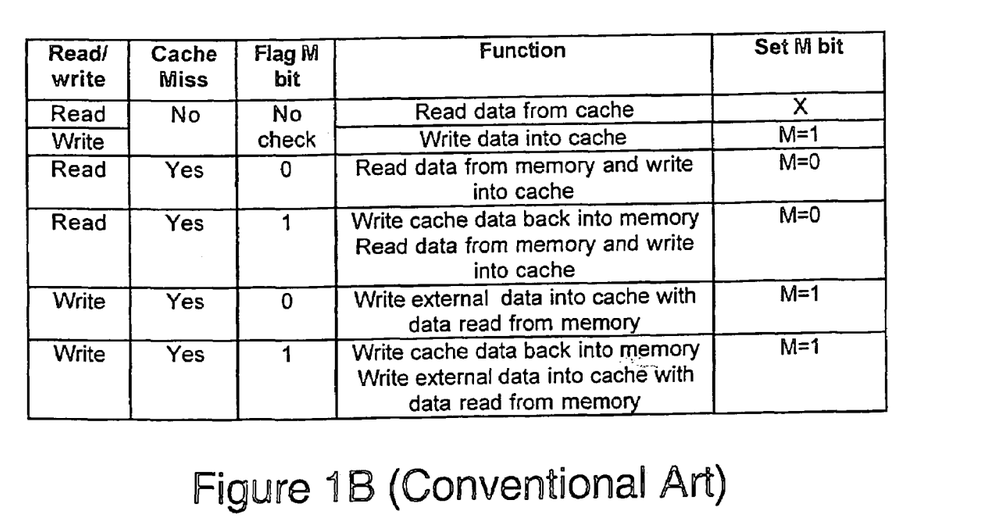
FIG. 1B is a table describing the architecture protocol for DRAM memory and SRAM cache according to an embodiment of the conventional art.

In one conventional art apparatus, an SRAM compatible device is built from DRAM. This device includes a multi-bank DRAM memory and an SRAM cache that stores the most recently accessed data. (See U.S. Pat. No. 5,999,474 by Wingyu Leung et. al., "Method and Apparatus for Complete Hiding of the Refresh of a Semiconductor Memory", Dec. 7, 1999.) This architecture, shown in FIGS. 1A and 1B, implements a write-back policy in which all write data is initially written to the SRAM cache prior to being written to the memory banks. The idea is to allow a refresh to occur when a cache hit occurs. When this architecture is required to sequentially write to two different banks at the same row and column address, a "ping-pong" effect takes place, creating continual cache misses, which creates a "blind hole", not allowing a refresh cycle to take place.

Accordingly, it would be desirable to have a DRAM memory cell architecture that is fully compatible with pure SRAM devices and that creates an opportunity for a hidden refresh cycle to be performed when sequential cache misses occur at the same addressed location within different memory banks.

SUMMARY OF THE INVENTION

According to embodiments of the present invention, a DRAM memory cell architecture is provided that is fully compatible with pure SRAM devices and that creates an opportunity for a hidden refresh cycle to be performed when sequential cache misses occur at the same address locations within different memory banks.

In various embodiments, a memory device architecture comprising at least one bi-directional bus for reading and writing to and from a plurality of memory banks and a cache is presented. The memory device architecture also comprises a first memory bank coupled to the bus, a second memory bank coupled to the bus, a cache coupled to the bus; and a modifiable bit (M-bit) in the cache TAG for controlling write-back to the memory banks from the cache.

In one embodiment, a memory device architecture is described wherein each memory bank comprises a plurality of DRAM cells.

A memory device architecture is described, according to one embodiment, wherein the cache comprises a plurality of static random access memory (SRAM) cells. In one embodiment, the memory banks and cache have the same configuration.

A memory device architecture is described in one embodiment of the present invention wherein a refresh cycle may occur when there is no pending request to write data from the cache back to the memory bank. During a write cycle and a cache hit, according to one embodiment, input data is written into the cache and the associated M-bit is set to "1".

A memory device architecture is described, according to one embodiment, wherein a bi-directional bus allows the memory device architecture to write data to a memory bank and read out the data from the memory bank and write to the cache in one cycle.

In one embodiment, a memory device architecture is described wherein, during a write cycle and a cache miss with the M-bit having a value of "1", data in the cache is written back to a first memory location in the first memory bank. Input data is then written into a second memory address location in the second memory bank. The input data is then read out from the second memory address location and written to the cache at a same addressed location and the M-bit is set to "0". Upon the next external operation accessing the same cache location, the second memory location is free for a refresh cycle since the cache and the memory bank contain the same information and there is no pending request to write back to the memory bank.

A memory device architecture is described in one embodiment wherein, during a write cycle and a cache miss with M-bit having a value of "0", input data is written into a third memory location, the input data is then read from the third memory location and written into the cache at the same location and the M bit is set to "0."

The present embodiments provide these advantages and others not specifically mentioned above but described in the sections to follow. Other features and advantages of the embodiments will become apparent from the following detailed description, taken in conjunction with the accompanying drawings, illustrating by way of example the principles of the embodiments.

BRIEF DESCRIPTION OF THE DRAWINGS

The accompanying drawings, which are incorporated in and form a part of this specification, illustrate embodiments of the invention.

DETAILED DESCRIPTION OF THE EMBODIMENTS

In the following detailed description of the embodiments, numerous specific details are set forth in order to provide a thorough understanding of the present invention. However, it will be recognized by one skilled in the art that the present invention may be practiced without some specific details or with equivalents thereof. In other instances, well-known methods, procedures, components, and circuits have not been described in detail as not to unnecessarily obscure aspects of the embodiments.

Some portions of the detailed descriptions which follow are presented in terms of procedures, steps, logic blocks, processing and other symbolic representations of operations on data bits that can be performed on computer memory systems. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be born in mind, however, that all of these and similar terms are to be associated with the appropriate physical quantities and are merely convenient labels applied to these quantities. Unless specifically stated otherwise, as apparent from the following discussions, it is appreciated that throughout the present invention, discussions utilizing the following terms refer to the actions and processes of a computer system or similar electronic computing device. These devices manipulate and transform data that is represented as physical (electronic) quantities within the computer system's registers and memories or other such information storage, transmission or display devices. The aforementioned terms include, but are not limited to, "select-ing" or "initiating" or "writing" or "reading" or "refreshing" or "comparing" or "writing back" or "reading out" or the like.

In accordance with the embodiments, a memory device architecture is designed using DRAM cells so as to be fully compatible with an SRAM device. This SRAM compatible device architecture is hereinafter referred to as one-transistor SRAM (1T-SRAM). The 1T-SRAM architecture includes multiple DRAM banks (e.g., 64) that can operate independently of each other so that operations, such as read, write, and refresh, can take place in different DRAM banks simultaneously. A mechanism is provided so that refresh access requests are simultaneously broadcast to multiple DRAM banks. The DRAM banks that receive the broadcast refresh request signal go through a refresh cycle only when there is no bank access pending.

An SRAM cache is incorporated to store the data of the most recently accessed locations. The SRAM cache may have a capacity approximately equal to the storage capacity of one of the DRAM banks.

Figure 2:
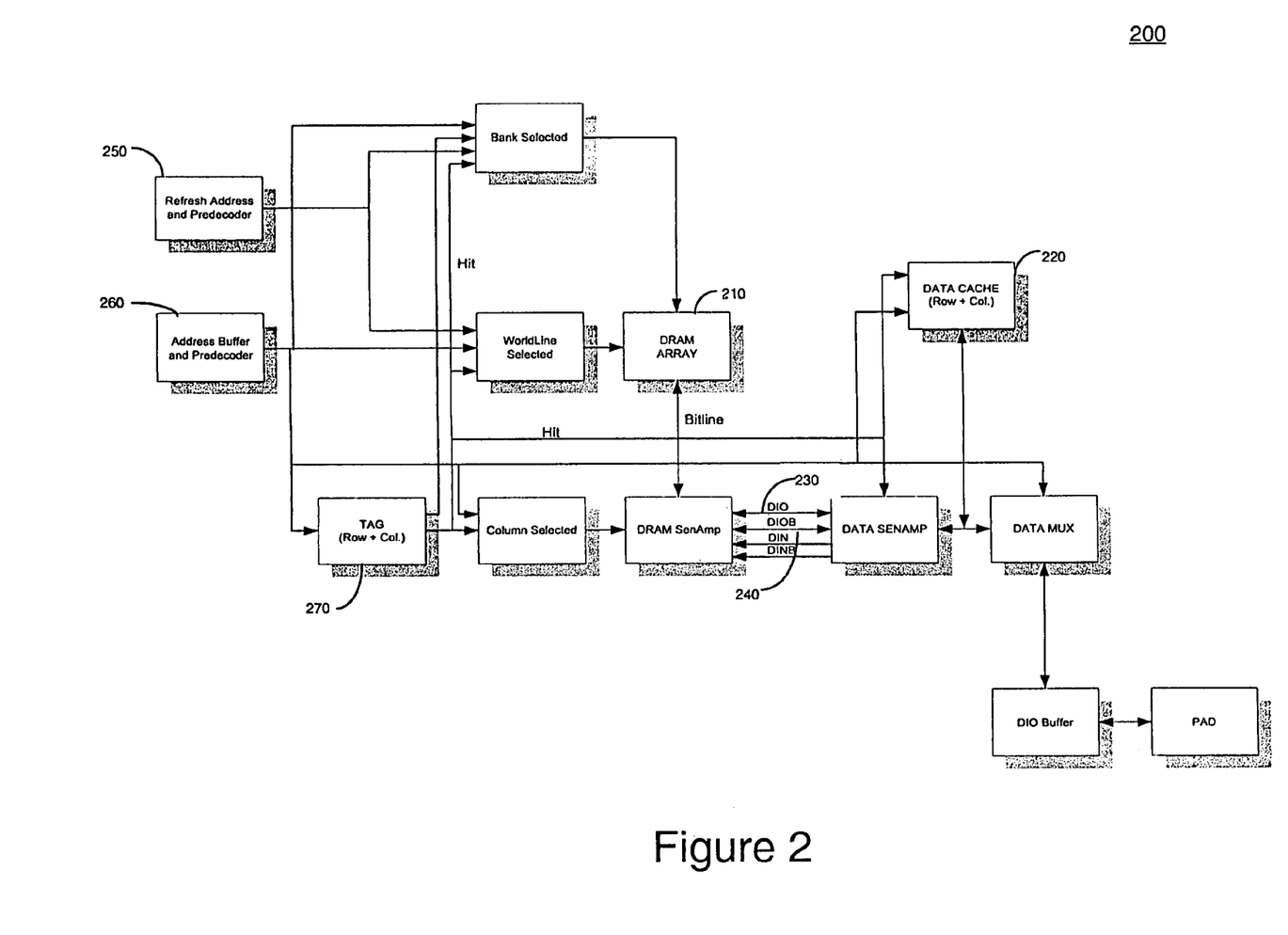
FIG. 2 is a block diagram of 1T-SRAM architecture with DRAM memory, SRAM cache and bi-directional busses for read and write-back, according to an embodiment of the present invention.

FIG. 2 is a block diagram of 1T-SRAM architecture 200 with DRAM array memory 210, SRAM data cache 220, cache tag memory 270 and bi-directional buses (DIO) 230 and (DIOB) 240 for read and write-back, according to one aspect of the embodiments. The bi-directional buses 230 and 240 allow for writing to DRAM array memory 210 and reading from DRAM memory 210 and writing to data cache 220 in one cycle. The DRAM memory 210 contains multiple (typically, but not limited to, 64) DRAM banks that share common read and write address buffer and predecoder 260 and bank refresh address and predecoder circuitry 250. When 1T-SRAM architecture 200 is powered up, an on-chip power-on reset circuit (not shown) asserts a clear signal, which is applied to cache tag memory 270.

When an access is initiated by an external circuit, an address is provided to address buffer 260 of FIG. 2. Address buffer 260 in turn routes the address to cache tag memory 270. The address identifies a DRAM bank, row and column to be accessed.

Figure 3:
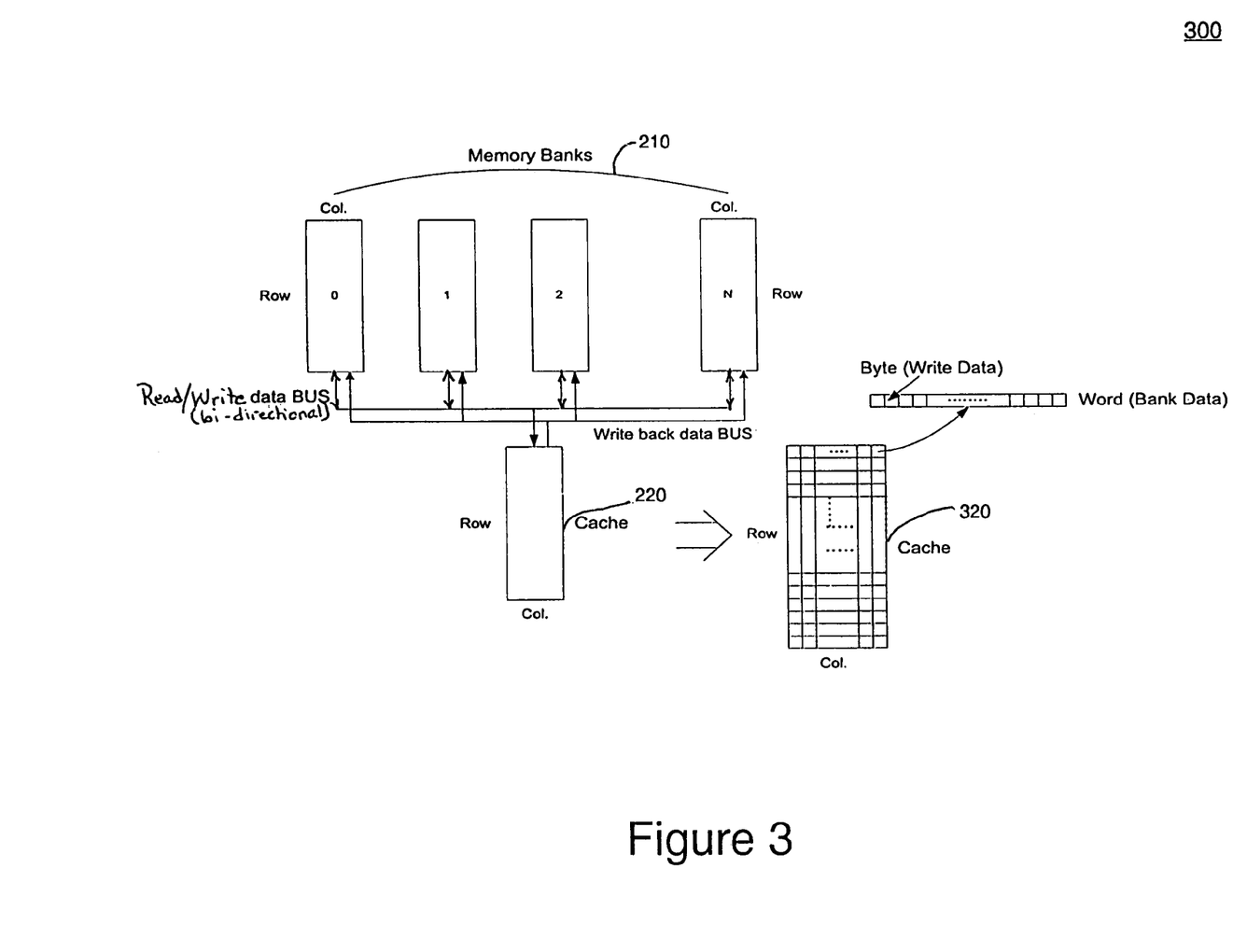
FIG. 3 is an illustration of row and column locations for writing to and reading from an array of memory banks and a cache, according to an embodiment of the present invention.

FIG. 3 is an illustration of row and column locations for writing to and reading from array of memory banks 210 and cache 220, according to one aspect of the embodiments. Each memory bank within memory bank array 210 is composed of columns and rows in a similar configuration as is shown by cache configuration 320. For example, an address, such as bank 2, row 1, column 2, stores cache entries of up to 256 bits from DRAM bank 2, row 1, column 2 of memory array 210 into row 1, column 2 of cache 220.

In the described example, cache tag memory 270 of FIG. 2 may retrieve the bank address stored in row 1, column 2 of bank 2 and may provide it to a comparator (not shown). Cache tag memory 270 also may provide the modified bit (M-bit) associated with the retrieved bank address. The comparator compares the bank address retrieved from cache tag memory 270 with the current bank address. If a match is detected, then a cache hit exists. If comparator 270 does not detect a match, then a cache miss exists. In response to signals for address, read or write access, M-bit and hit or miss indication, it can be determined whether the current access is a read hit, a write hit, a read miss or a write miss.

Figure 4:
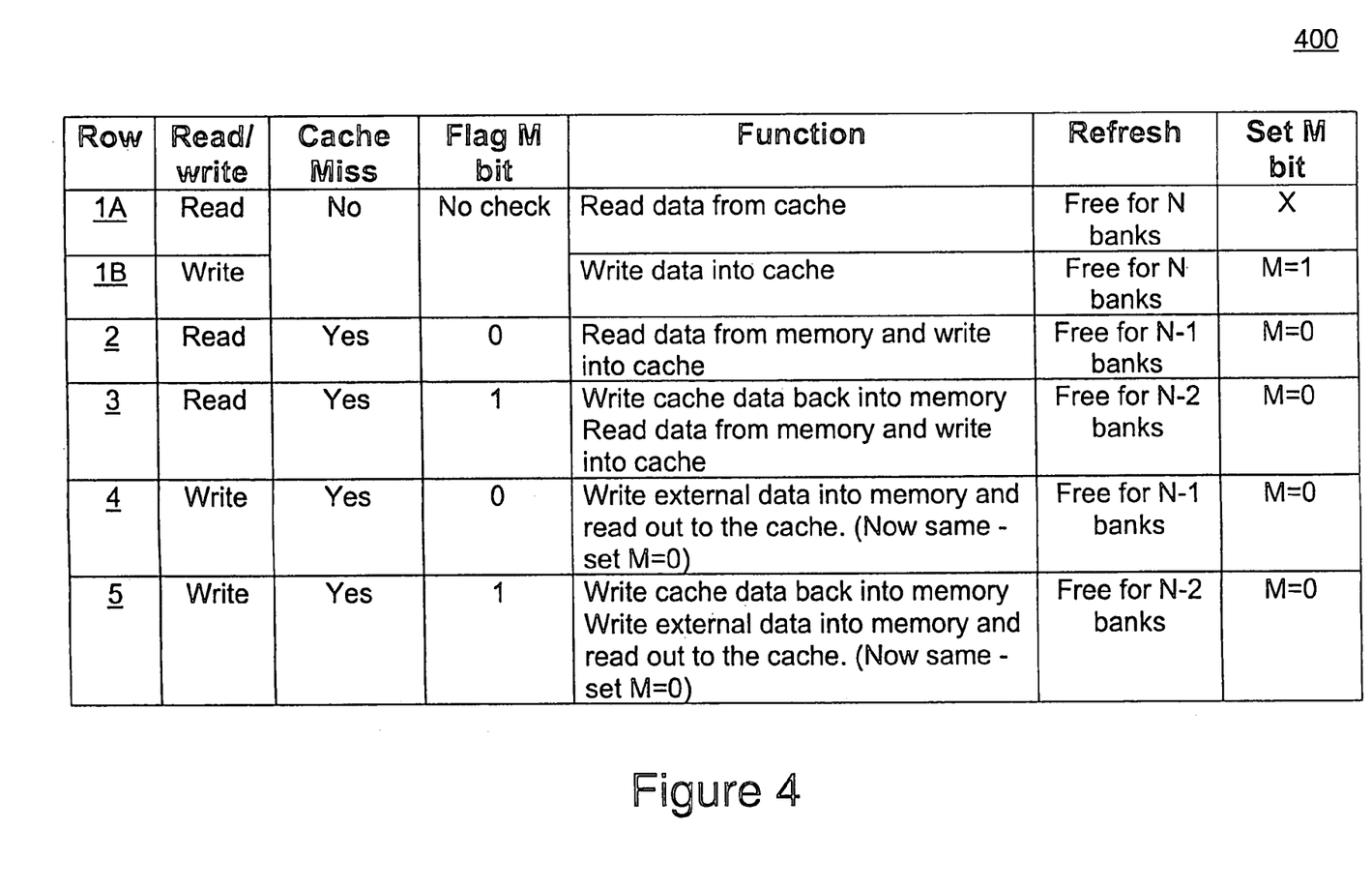
FIG. 4 is a table of the 1T-SRAM protocol according to embodiments of the present invention.

Referring now to FIG. 4, a table 400 illustrating the 1T-SRAM protocol, according to the embodiments is presented. The read and write policy of one aspect of the embodiments will now be described for the read and write transactions of read hit, write hit, read miss and write miss according to embodiments of the present invention. Row 1A illustrates the 1T-SRAM protocol for read access with a cache (e.g., cache 220 of FIGS. 2 and 3) hit. When there is a cache hit, there is no need to check for the M-bit setting since there is no need to write data back into memory. Therefore, the 1T-SRAM protocol reads the data from cache 220 and all memory banks (e.g., DRAM array 210 of FIG. 2) are free for a refresh cycle. At this point, nothing has been written and nothing changed, so there is no need to set the M-bit.

Row 1B of table 400 of 1T-SRAM protocol illustrated in FIG. 4 shows the protocol for write access with a cache hit according to one embodiment. Again, when there is a cache hit there is no need to check the M-bit and the 1T-SRAM protocol writes data into the data cache. With there being no write back request pending, all banks are free for a refresh cycle. Following the write-to-cache operation, the M-bit is set to 1 and the next operation on the same cache location with a cache miss will cause a write back operation.

Referring now to Row 2 of table 400, a read access with a cache miss is shown, in accordance with an embodiment of the present invention, for which the M-bit has a value of "0". In this embodiment, an M-bit value of "0" is indicative of the cache data and memory data being the same as of the last cycle of operation and, therefore, not requiring a write back operation. Thus, the data is read from the required memory location and written to cache. During this cycle, all memory banks, except the one from which data is being read, are free for refresh. It should be appreciated that at the conclusion of this cycle of operation, the M-bit is set to "0" and the next operation for the same cache location will free the associated memory bank for a refresh cycle.

Row 3 of the table 400 illustrates the 1T-SRAM protocol for a read access with a cache miss for which the M-bit has a value of "1" in accordance with an embodiment. In this instance, the cache and memory data are different and the cache writes back the data into memory before reading the next data from memory and writing to the cache. During this cycle, all memory banks are free for refresh with the exception of the memory bank to which the cache writes back and the memory bank from which data is being read to the cache. At the conclusion of this cycle of operation, the M-bit is set to "0" and the next operation at the same location in cache will thereby free the associated memory bank for refresh.

In Row 4 of the table 400 of FIG. 4, the 1 T-SRAM protocol for a write access with a cache miss and an M-bit set to "0", in accordance with one aspect of the embodiments, is illustrated. The input data is written directly to memory (e.g., memory 210 of FIG. 2) and read out to the data cache. During this cycle only one memory bank is not free for a refresh so that all others can be refreshed. At the end of this cycle, the data in cache and memory are the same and the M-bit is set to "0". Upon the next operation requiring the same cache address, a write-back to memory will not be required and the affiliated memory bank will be free for a refresh cycle.

Row 5 of the table 400 illustrates the 1T-SRAM protocol for a write access with a cache miss and M-bit equal to "1". For this operation, the cache data is first read back into the associated memory bank location. The input data is then written directly to memory and read out from memory and written to the data cache at the same row and column location. During this cycle, all memory banks are free for refresh with the exception of the memory bank to which the cache writes back and the memory bank from which data is being written to and read from the cache. The M-bit is set to "0" and, upon the next access for the same cache location, a write-back to memory will not be required and the affiliated memory bank will be free for a refresh cycle.

It should be appreciated that this protocol assures that sequential cache to memory write-backs will not occur as a result of sequential operations involving like row and column addresses in different memory banks. Therefore, the memory banks will be free for a refresh cycle no less frequently than once following every other operation.

Figure 5:
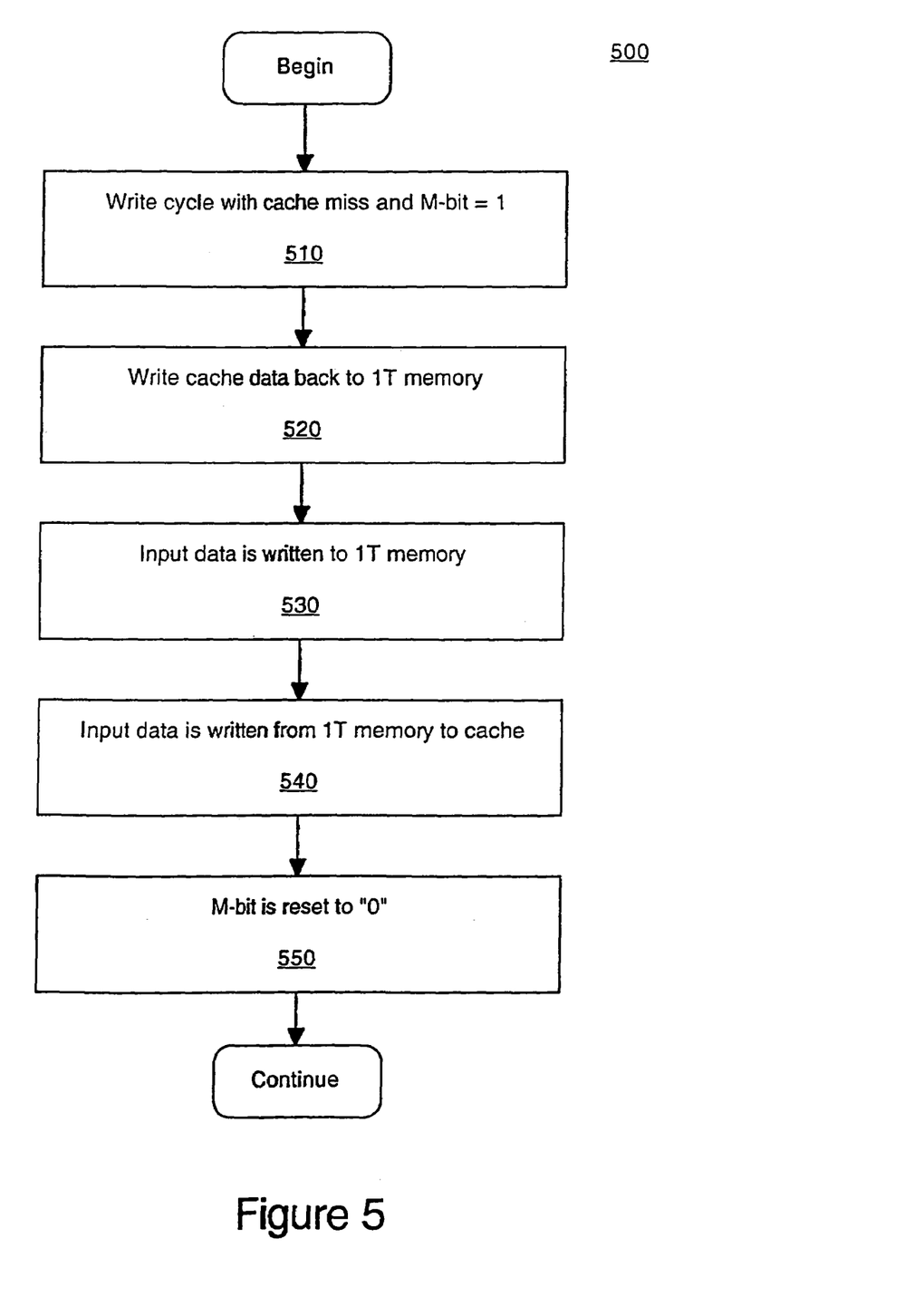
FIG. 5 is a flow diagram of steps performed, in accordance with one embodiment of the present invention, in a method for performing a write cycle with a cache miss and an M-bit set to 1.

FIG. 5 is a flow diagram 500 of steps performed, in accordance with one embodiment of the present invention, in a method for performing a write cycle with a cache miss and an M-bit set to 1 according to one embodiment of the present invention. Although specific steps are disclosed in flow diagram 500, such steps are exemplary. That is, the present invention is well suited to performing various other steps or variations of the steps recited in FIG. 5.

At step 510 of FIG. 5, a write cycle access is required and it is determined that the memory bank address to which the input data is to be written contains data that is different than the data at the same address in cache 220 (FIGS. 2 and 3). The M-bit has a value of "1" indicating that the data in cache 220 must be written back to memory 210 before other operations can be performed.

At step 520 of FIG. 5, the data in cache 220 at the column and row of the memory being addressed is written back to that address in the memory bank within memory 210 (FIG. 3) from which it was originally written. The process then moves to step 530.

At step 530, the input data is written to the appropriate memory bank within the DRAM memory array 210. At step 540, it is read out to cache 220 at the same row and column address. As the data in memory 210 and cache 220 is now the same, the M-bit is reset to "0" as shown in step 550. The next operation at a same row and column will not require the cache data to be written back to memory 210 and will free up the memory bank so a refresh cycle can occur.

Figure 6:
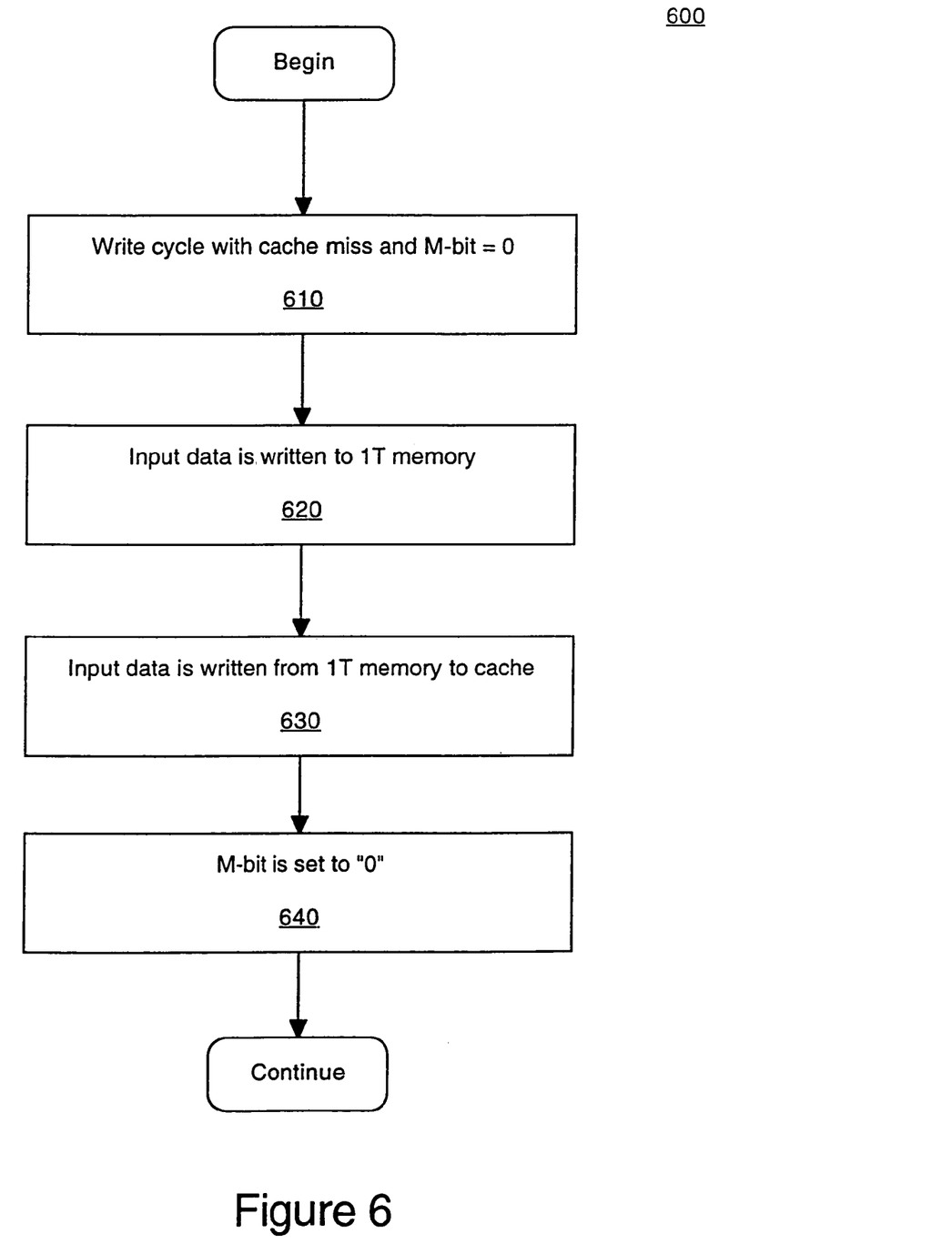
FIG. 6 is a flow diagram of steps performed, in accordance with one embodiment of the present invention, in a method for handling a cache miss for a write operation with an M-bit equal to "0" in accordance with one embodiment of the present invention.

FIG. 6 is a flow diagram 600 of steps performed, in accordance with one embodiment of the present invention, in a method for handling a cache miss for a write operation with an M-bit equal to "0" in accordance with one embodiment of the present invention. Although specific steps are disclosed in flow diagram 600, such steps are exemplary. That is, the present invention is well suited to performing various other steps or variations of the steps recited in FIG. 6.

At step 610 of FIG. 6, a write cycle access is required and the cache tag comparator has determined that the memory bank address within memory array 220 (FIG. 3) to which the input data is to be written contains data that is different than the data at the same address in cache 210. The M-bit has a value of "0", however, indicating that the data in the cache need not be written back to memory.

At step 620, the input data is written to the appropriate memory bank where it is combined with the data already there. The process then moves to step 630 where it is read out to cache 210 at the same row and column address. As the data in memory 220 and cache 210 is now the same, the M-bit is reset to "0" as shown in step 640. The next operation at a same row and column will not require the cache data to be written back to memory 220 and will free up the memory bank so a refresh cycle can occur.

The foregoing descriptions of specific embodiments have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A memory device architecture comprising:
   a first bi-directional bus and a second bi-directional bus, said first and second bi-directional buses in parallel coupling a plurality of memory banks with a data cache, said first and second bi-directional buses for reading data from said plurality of memory banks and writing said data to said cache;
   a first memory bank coupled to said first and second bi-directional buses;
   a second memory bank coupled to said first and second bi-directional buses; and
   a cache TAG coupled to said first and second bi-directional buses;
   wherein a modifiable bit in said cache TAG is configured to control write-back to said first memory bank or said second memory bank from said data cache, wherein during a write cycle and a cache miss with said modifiable bit set:
      data in said data cache is written back to a first memory location in said first memory bank;
      input data is written into a second memory location in said second memory bank;
      said input data is read out from said second memory location and written to said data cache at a corresponding location; and
      unsetting said modifiable bit.

2. A memory device architecture as described in claim 1 wherein upon a subsequent operation accessing said same data cache location said second memory location is designated as available for a refresh cycle.

3. A memory device architecture as described in claim 1 wherein, during a write cycle and a cache miss and with said modifiable bit not being set:
   input data is written into a third memory location;
   said input data is read from said third memory location and written into said data cache at a corresponding location; and
   said modifiable bit remains unset.

4. A memory device architecture as described in claim 1 wherein said first and second memory banks comprise a plurality of dynamic random access memory (DRAM) cells.

5. A memory device architecture as described in claim 4 wherein said data cache comprises a plurality of static random access memory (SRAM) cells.

6. A memory device architecture as described in claim 1 wherein for every location in one of said memory banks there exists a corresponding location in said data cache.

7. A memory device architecture as described in claim 1 wherein a refresh cycle may occur when there is no pending request to write data from said data cache back to said memory bank.

8. A memory device architecture as described in claim 1 wherein said first and second bi-directional buses allow said memory device architecture to write data to a memory bank and read out said data to said data cache in one cycle.

9. A memory device architecture as described in claim 1 wherein, during a write cycle and a cache hit, input data is written into said data cache and said bit is set to a first value.

10. A memory device architecture comprising:
    a first bi-directional bus and a second bi-directional bus, said first and second bi-directional buses in parallel coupling a plurality of memory banks with a data cache, said first and second bi-directional buses for reading data from said plurality of memory banks and writing said data to said cache;
    a first memory bank coupled to said first and second bi-directional buses;
    a second memory bank coupled to said first and second bi-directional buses; and
    a cache TAG coupled to said first and second bi-directional buses;
    wherein a modifiable bit in said cache TAG is configured to control write-back to said first memory bank or said second memory bank from said data cache, wherein during a write cycle and a cache miss and with said modifiable bit not being set:
       input data is written into a third memory location;
       said input data is read from said third memory location and written into said data cache at a corresponding location; and
       said modifiable bit remains unset.

11. A method for performing a write cycle having a cache miss with a modifiable bit set thereby indicating that cached data is to be written back to memory, said method comprising:
    writing data from a data cache back to a first memory location in a first memory bank in a memory device comprising first and second bi-directional buses coupling a plurality of memory banks with said data cache, said plurality of memory banks comprising said first memory bank and a second memory bank, said memory device further comprising a cache TAG coupled to said buses, wherein said modifiable bit is in said cache TAG;
    writing input data into a second memory location in said second memory bank;
    reading out said input data from said second memory location and writing said input data to said data cache at a same location; and
    unsetting said modifiable bit.

12. The method of claim 11 wherein said first and second memory banks comprise a plurality of one-transistor (1T) memory cells, said 1T memory cells requiring a refresh cycle within a predetermined period.

13. The method of claim 11 wherein said data cache comprises a plurality of static random access memory (SRAM) cells.

14. The method of claim 11 wherein for every location in one of said memory banks there exists a corresponding location in said data cache.

15. The method of claim 11 wherein a refresh cycle occurs when there is no pending request to write data from said data cache back to said memory bank.

16. The method of claim 11 wherein said first bi-directional bus and said second bi-directional bus are parallel buses that allow said memory device to write data to a memory bank and read out said data to said data cache in one cycle.

17. The method of claim 11 wherein a refresh cycle is independently controlled within each said memory bank by control circuitry.

18. A method for performing a write cycle having a cache miss with said modifiable bit not being set thereby indicating that cached data need not be written back to memory, said method comprising:
- writing input data into a first memory location in a first memory bank in a memory device comprising first and second bi-directional buses coupling a plurality of memory banks with a data cache, said plurality of memory banks comprising said first memory bank and a second memory bank, said memory device further comprising a cache TAG coupled to said buses, wherein said modifiable bit is in said cache TAG;
- reading out said input data from said first memory location and writing said input data to said data cache at a same location; and
- leaving said bit unset.

19. The method of claim 18 wherein said first and second memory banks comprise a plurality of dynamic random access memory (DRAM) cells.

20. The method of claim 18 wherein said data cache comprises a plurality of static random access memory (SRAM) cells.

21. The method of claim 18 wherein for every location in one of said memory banks there exists a corresponding location in said data cache.

22. The method of claim 18 wherein said first bi-directional bus and said second bi-directional bus are parallel buses that allow said memory device to write data to said first or second memory bank and read out said data from said memory bank and write said data to said data cache in one cycle.

23. The method of claim 22 wherein a refresh cycle occurs when there is no pending request to write data from said data cache back to said memory bank.

24. The method of claim 23 wherein said refresh cycle is independently controlled within each said memory bank by control circuitry.

* * * * *